United States Patent [19]

Saikaishi et al.

[11] 3,971,992

[45] July 27, 1976

[54] APPARATUS FOR PRESETTING RECEIVERS OF THE SYNTHESIZING TYPE

[75] Inventors: Noboru Saikaishi; Tsuneo Yamada; Tetsuo Takahashi; Yukio Numata, all of Tokyo, Japan

[73] Assignee: Trio Electronics Incorporated, Tokyo, Japan

[22] Filed: Sept. 17, 1974

[21] Appl. No.: 506,789

[30] Foreign Application Priority Data
Dec. 28, 1973 Japan .................................. 49-2115

[52] U.S. Cl. ................................ 325/464; 325/470
[51] Int. Cl.$^2$ ........................................... H04B 1/32
[58] Field of Search .......... 325/455, 459, 470, 468, 325/464

[56] References Cited
UNITED STATES PATENTS

| | | | |
|---|---|---|---|
| 3,803,494 | 4/1974 | Howell et al. | 325/459 |
| 3,845,394 | 10/1974 | Hamada | 325/455 |
| 3,864,637 | 2/1975 | Kanow | 325/470 |

*Primary Examiner*—George H. Libman
*Attorney, Agent, or Firm*—Charles E. Pfund

[57] ABSTRACT

In a method of presetting a receiver of the synthesizing type wherein the ratio of frequency division of a frequency divider in a phase locked loop is set in accordance with the content of an up-down counter, a search signal and a write signal are generated for sweeping the up-down counter, the contents of the up-down counter are sequentially written in a memory device each time an intermediate frequency output is obtained, and the up-down counter is preset in accordance with a data read out of the memory device thereby enabling the receiver to receive the signal from a desired broadcasting station.

4 Claims, 2 Drawing Figures

3,971,992

APPARATUS FOR PRESETTING RECEIVERS OF THE SYNTHESIZING TYPE

BACKGROUND OF THE INVENTION

This invention relates to a method and apparatus for presetting a receiver and more particularly to a method and apparatus for presetting a receiver wherein the oscillation frequency of a local oscillator is set by means of a synthesizing system for the purpose of selecting a broadcasting station.

A receiver utilizing a synthesizing system contemplates stable reception of the signal wave by producing a local oscillation from a voltage controlled oscillator in a phase locked loop. In this case, a programmable frequency divider is included in the feed-back loop for the phase locked loop and the result of the comparison of the frequency of the frequency divided signal and a reference frequency is used to control the voltage controlled oscillator so that the accuracy of the local oscillation frequency is determined by the accuracy of the reference frequency. For this reason, it is possible to perform a stable reception by using a crystal oscillator as the source of the reference frequency. Change of the local oscillation frequency, that is the station selection, is made by properly setting the ratio of frequency division of the frequency divider. As a method of setting the ratio of frequency division, so-called automatic tuning method has been proposed wherein an up-down counter is swept with a sweeping pulse and when an output having an intermediate frequency of the received high frequency signal is obtained the counting operation of the up-down counter is stopped and the ratio of frequency division is set. A method of setting the up-down counter by using a manually operated transfer switch has also been used.

Where the automatic tuning is performed by the method of setting just described each time an intermediate frequency output is obtained (or a station is selected) the counting operation of the up-down counter is stopped so that in order to set a desired broadcasting station it is necessary to restart the up-down counter each time it stops. Such station selection operation is of course troublesome. Further, in the case of the manual setting because the frequency of the broadcasting station is different in a particular receiving area the operator is required to be informed beforehand of the frequency of the desired broadcasting station. Such station selection operation is also troublesome.

SUMMARY OF THE INVENTION

Accordingly, it is an object of this invention to provide a novel method and apparatus for presetting a receiver capable of eliminating the difficulties described above.

According to one aspect of this invention there is provided a method of presetting a receiver of the synthesizing type wherein the ratio of the frequency division of a frequency divider contained in a phase locked loop is set in accordance with the content of an up-down counter, comprising the steps of generating a search signal and a write signal, sweeping the up-down counter in accordance with the search and write signals, sequentially writing the contents of the up-down counter in a memory device each time an intermediate frequency output is obtained, and presetting the up-down counter in accordance with data selected and read out from the memory device thereby enabling the receiver to receive the signal from a desired broadcasting station.

According to another aspect of this invention, there is provided apparatus for presetting a receiver comprising a memory device, an up-down counter constructed to send out control signals at the counts thereof corresponding to the opposite ends of a frequency band to which the receiver can respond and to exchange data with the up-down counter, an address shift register for designating an address in the memory device, means for generating a search signal and a write signal, a flip-flop circuit which is set and reset by the control signals when the search and write signals are supplied thereto, and a gate circuit for sending the write signal to the up-down counter for storing the content of the up-down counter in the memory device and for sending a shift signal to the address shift register each time an intermediate frequency output is obtained between the set and reset state of the flip-flop circuit.

BRIEF DESCRIPTION OF THE DRAWING

Further objects and advantages of the invention can be more fully understood from the following description taken in conjunction with the accompanying drawing in which.

DESCRIPTION OF THE PREFERRED EMBODIMENT

Figure 1:
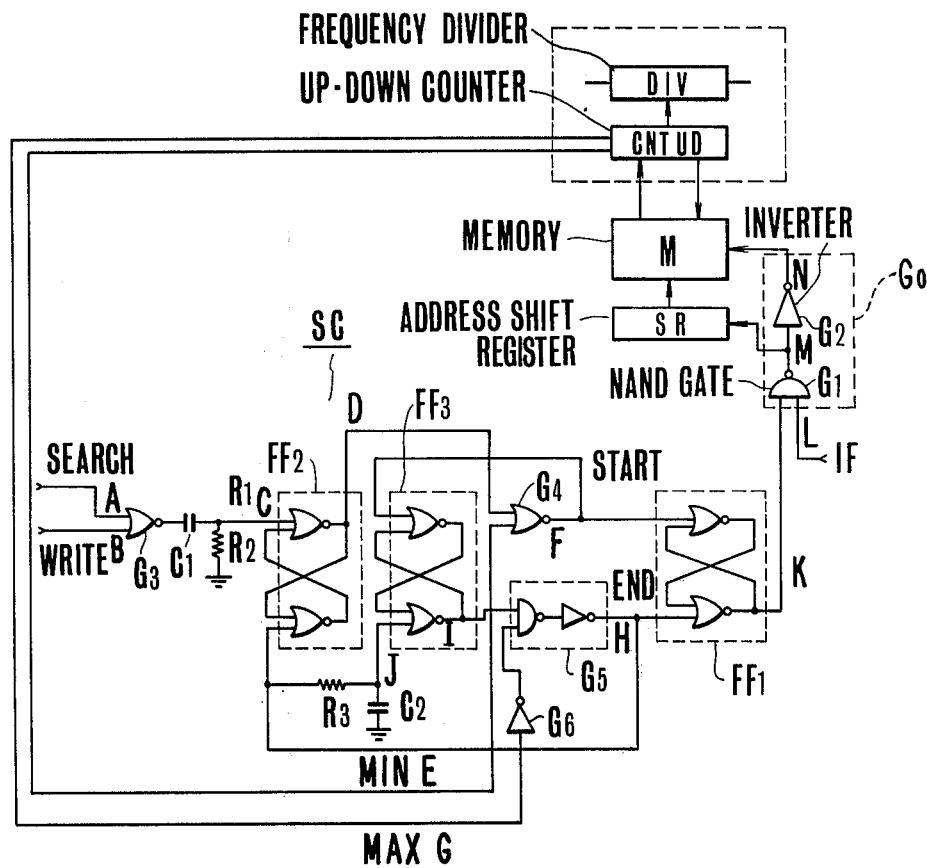
FIG. 1 is a block connection diagram of the apparatus for presetting a receiver embodying the invention.

A preferred embodiment of this invention illustrated in FIG. 1 comprises an up-down counter $CNT_{uD}$ for setting the ratio of frequency division of a frequency divider DIV provided with a phase locked loop, not shown. The up-down counter $CNT_{uD}$ is constructed to interchange data with a memory device M. In other words, the content of the up-down counter $CNT_{uD}$ is written in the memory device M and the data read out from the memory device is preset in the up-down counter. Further, the up-down counter is constructed such that at its counts respectively corresponding to the maximum frequency and the minimum frequency of the frequency band, the frequencies in this band being receivable by the receiver, the up-down counter produces MAX and MIN pulses which are supplied to a search preset control circuit to be described later.

The address designation of the memory device M is varied sequentially in accordance with the content of an address shift register SR while the writing in the memory device M is carried out by supplying a write enabling signal. The shift signal for the address shift register SR is produced by a NAND gate circuit $G_1$ while the input to this NAND gate circuit is produced by applying a signal IF which is produced when a receiver (not shown) produces an output of the intermediate frequency through the NAND gate circuit $G_1$ by enabling the same by an output from an R-S flip-flop circuit $FF_1$. The output from the NAND gate circuit $G_1$ is also applied to the memory device M via an inverter $G_2$ to act as a write enabling signal.

The set and reset operations of the R-S flip-flop circuit $FF_1$ are performed by the start output and the end output of a search preset control circuit SC. The search preset control circuit SC is constructed such that it produces the start signal in accordance with the signal MAX from the up-down counter $CNT_{UD}$ after operation of search and write switches, not shown, and that it produces the end signal when the signal MAX is received after the start signal has been sent out. The detail of the search preset circuit SC is as follows:

More particularly, a search signal and a write signal are applied to the inputs of an NOR gate circuit $G_3$, the output thereof being applied to a differentiating circuit including a capacitor $C_1$ and a resistor $R_2$ to produce a pulse having a definite width. This pulse is used to set an R-S flip-flop circuit $FF_2$ and the reset output from the flip-flop circuit $FF_2$ is applied to one input of a NOR gate circuit $G_4$ with its other input connected to receive the signal MIN from the up-down counter $CNT_{UD}$ whereby the NOR gate circuit $G_4$ is enabled to produce the start signal. The start signal is also used to set an R-S flip-flop circuit $FF_3$, and the set output thereof is applied to one input of an AND gate circuit $G_5$, the other input thereof being connected to receive the signal MAX from the updown counter via an inverter $G_6$. As a result, in response to the first signal MAX following to the signal MIN, the AND gate $G_5$ is enabled to produce the end signal. Further, the end signal is applied to the reset input of the flip-flop circuit $FF_2$. A portion of the end signal is delayed by an integrating circuit including a resistor $R_3$ and a capacitor $C_2$ and the delayed signal is applied to the reset terminal of the flip-flop circuit $FF_3$.

Figure 2:
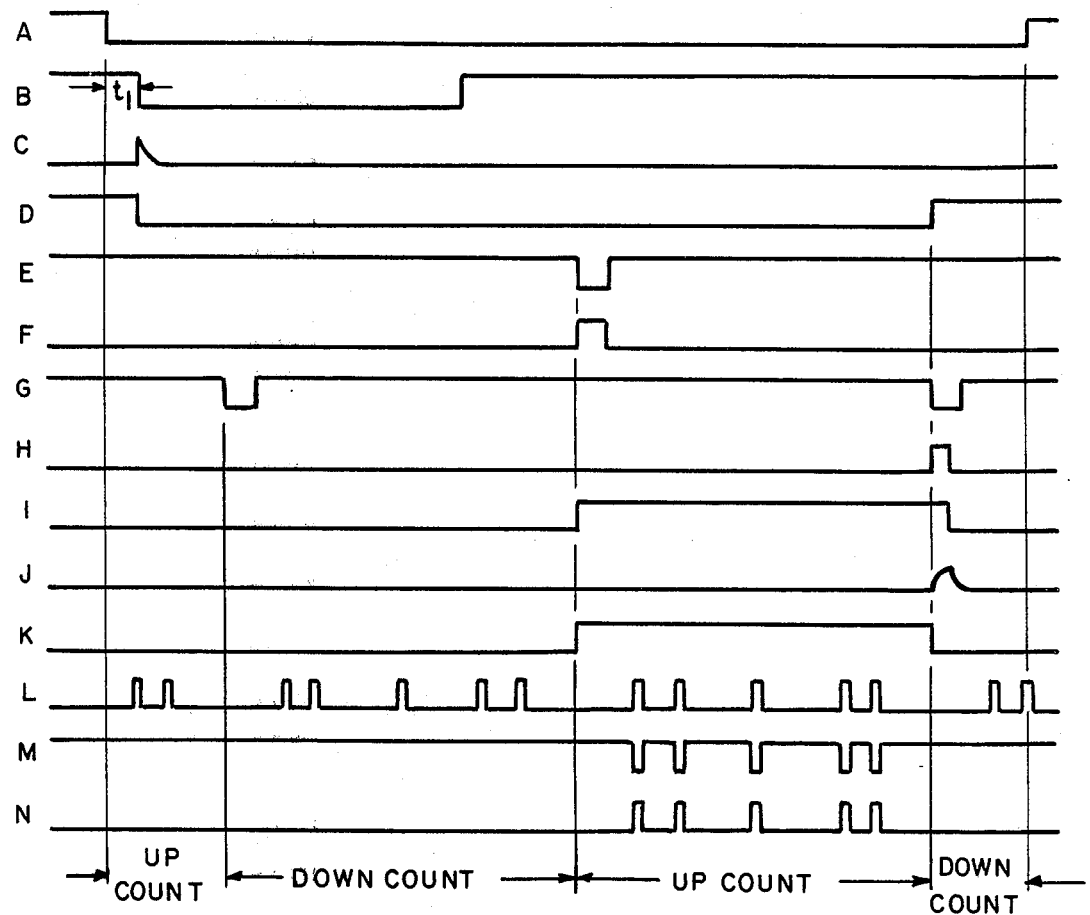
FIG. 2 is a waveform diagram useful to explain the operation of the circuit of FIG. 1.

Referring to FIGS. 1 and 2, the preset apparatus described above operates as follows. To write (or preset) into the memory device M the content of the up-down counter $CNT_{UD}$ corresponding to a broadcasting station having a frequency to which the receiver is respondable the search and write signals A and B are supplied to NOR gate $G_3$ and the R-S flip-flop circuit $FF_2$ is set by a differentiated signal C thereby enabling the NOR gate circuit $G_4$ by a signal D of R-S flip-flop circuit $FF_2$. Further, when the search signal A is supplied, the up-down counter commences to count, and when a signal MIN (E) corresponding to minimum frequency, which the receiver can receive, is produced, a start signal F is produced by the NOR gate circuit $G_4$ to set the R-S flip-flop circuit $FF_1$, thereby enabling the NAND gate circuit $G_1$ of a gate circuit $G_0$. Under these conditions, concurrently with the generation of the signal IF (L), a write enabling signal N is applied to the memory device M from the output of inverter $G_2$ of the gate circuit $G_0$ and a shift signal M is applied to the shift register SR, thus writing the content of the up-down counter into the memory device M at an instant when the signal IF (L) is produced. Further, the content of the address shift register is shifted one digit by the shift signal M thus designating the address of the data to be subsequently written in the memory device M. At the same time, a signal I is produced by setting the R-S flip-flop $FF_3$ by the end signal H thereby enabling the AND gate $G_5$, and therefore the AND gate $G_5$ is brought into a state waiting for the maximum frequency G from the up-down counter. In this manner, each time the signal IF is produced, the contents of the up-down counter $CNT_{UD}$ are sequentially written in the memory device M. When a signal MAX (G) is produced by the up-down counter $CNT_{UD}$, the R-S flip-flop circuit $FF_1$ is reset by the end signal h produced by the AND gate circuit $G_5$ thereby disenabling the NAND gate circuit $G_1$. Thus, all data corresponding to the broadcasting stations to which the receiver is respondable are stored in the memory device M. At the same time, R-S flip-flop circuits $FF_2$ and $FF_3$ are returned to their original states by the end signal H and integrating signal J, thereby completing the presetting operation. In FIG. 2, a time lag $t_1$ between the search signal A and the write signal B is of an optional period.

To receive the wave from a desired broadcasting station a switch, not shown, corresponding to the address of the station in the memory device M is operated for designating the address. At the same time, a read request signal for according the state of up-down counter to data written in the memory device M is sent out to preset the data stored in the memory device M into the up-down counter $CNT_{UD}$. In this case, the switch and the address in the memory device M are made to correspond with each other according to the order of storing information in the memory device M.

With this construction, the contents of the up-down counter are stored in the memory device by the signal corresponding to the minimum frequency E in a frequency band to which the receiver is respondable so as to vary the frequency of the local oscillator, and each time an intermediate frequency output L is obtained the content of the up-down counter is stored sequentially in the memory device until the maximum frequency G is reached, so that it is possible to preset sequentially all data regarding the frequencies of the local oscillator corresponding to the frequencies of the broadcasting stations to which the receiver can respond. The reception of the wave from any desired broadcasting station is made possible by the operation of a switch.

Although in the illustrated embodiment the contents of the up-down counter are successively preset in the memory device starting from the minimum frequency in the frequency band to which the receiver can respond it should be understood that it is also possible to preset the contents starting from the maximum frequency and then proceed to the minimum frequency by reversely supplying the minimum frequency E to the search preset control circuit S C.

As described above according to the method and apparatus of this invention for presetting a receiver it is possible to readily select a desired office irrespective to the receiving area. Moreover, as the contents of the up-down counter are preset in the memory device according to the order of reception, it is possible to decrease the capacity of the memory device.

What is claimed is:

1. Apparatus for presetting a receiver comprising a memory device, and up-down counter constructed to send out control signals at the counts thereof corresponding to the opposite ends of a frequency band to which said receiver can respond and to exchange data with said memory, an address shift register for designating an address in said memory device, means for generating a search signal and a write signal, a flip-flop circuit conditioned by said search and write signals to be set and reset by said control signals when said search and write signals are supplied to said flip-flop circuit, and a gate circuit responsive to said flip-flop circuit and to detecting an intermediate frequency output for sending a write enabling signal to said memory device for storing the content of said up-down counter in said memory device and for sending a shift signal to said address shift register each time said intermediate frequency output is obtained between the set and reset states of said flip-flop circuit.

2. The apparatus according to claim 1 wherein said gate circuit $G_0$ comprises a NAND gate circuit ($G_1$), means to apply an intermediate frequency signal to one input of said NAND gate circuit ($G_1$), means to apply the output of said flip-flop circuit ($FF_1$) to the other input of said NAND gate circuit ($G_1$), means for applying the output of said NAND gate circuit to said address shift register (SR), and an inverter ($G_2$) connected between the output of said NAND gate circuit and said memory device (m).

3. The apparatus according to claim 1 which further comprises a search preset control circuit (SC) including a first AND gate circuit ($G_3$) connected to receive said search and write signals, a differentiating circuit ($C_1$, $R_2$) for differentiating the output of said first AND gate circuit ($G_3$) to produce a pulse of a definite width, a second flip-flop circuit ($FF_2$) connected to be set by said pulse, a NOR gate circuit ($G_4$) for producing a start signal in response to the output of said second flip-flop circuit ($FF_2$) and one control signal (MIN) generated by said up-down counter ($CNT_{ud}$) at a minimum frequency to which the receiver can respond, a third flip-flop circuit ($FF_3$) connected to be set by said start signal, a second AND gate circuit ($G_5$) for generating an end signal in response to the output of said third flip-flop circuit ($FF_3$) and the other control signal (MAX) generated by said up-down counter at a maximum frequency to which the receiver can respond, means for applying said start signal and said end signal to said first mentioned flip-flop circuit ($FF_1$), and a delay circuit ($R_3$, $C_2$) for delaying said end signal and for applying the delayed signal to the reset terminal of said third flip-flop circuit ($FF_3$).

4. The apparatus according to claim 3 wherein said delay circuit comprises an integrating circuit.

* * * * *